(12) United States Patent
Zhang et al.

(10) Patent No.: US 11,855,631 B2
(45) Date of Patent: Dec. 26, 2023

(54) ASYMMETRICAL I/O STRUCTURE

(71) Applicant: MONTAGE TECHNOLOGY CO., LTD., Shanghai (CN)

(72) Inventors: Xiong Zhang, Shanghai (CN); Chunlai Sun, Shanghai (CN); Juan Du, Shanghai (CN); Gang Shi, Shanghai (CN); Chonghe Yang, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 152 days.

(21) Appl. No.: 17/406,370

(22) Filed: Aug. 19, 2021

(65) Prior Publication Data
US 2022/0060187 A1 Feb. 24, 2022

(30) Foreign Application Priority Data
Aug. 19, 2020 (CN) .......................... 202010836533.9

(51) Int. Cl.
| | |
|---|---|
| *H03K 19/0944* | (2006.01) |
| *H03K 19/003* | (2006.01) |
| *H03K 17/10* | (2006.01) |
| *H03K 17/687* | (2006.01) |
| *H03K 19/00* | (2006.01) |

(52) U.S. Cl.
CPC ....... *H03K 19/0944* (2013.01); *H03K 17/102* (2013.01); *H03K 17/687* (2013.01); *H03K 19/0005* (2013.01); *H03K 19/00315* (2013.01)

(58) Field of Classification Search
CPC ......... H03K 19/0005; H03K 19/00315; H03K 19/0013; H03K 19/0175; H03K 19/017509; H03K 19/0944; H03K 19/0185; H03K 19/01857; H03K 17/10; H03K 17/102; H03K 17/687; H03K 17/6871; H03K 17/6872
See application file for complete search history.

(56) References Cited

U.S. PATENT DOCUMENTS

| | | | | |
|---|---|---|---|---|
| 5,903,501 | A * | 5/1999 | Kurosaki ............. | G11C 7/1051 365/189.11 |
| 6,670,939 | B2 * | 12/2003 | Yang .................... | G09G 3/3677 345/212 |
| 6,768,369 | B1 * | 7/2004 | Dunn ................... | H03K 17/145 327/534 |
| 6,906,561 | B2 * | 6/2005 | Yu ..................... | H03K 19/00315 327/112 |
| 7,750,705 | B2 * | 7/2010 | Ueno ............... | H03K 3/356165 326/86 |

(Continued)

*Primary Examiner* — Jason Crawford
(74) *Attorney, Agent, or Firm* — Oliff PLC

(57) ABSTRACT

An asymmetrical I/O structure is provided. In one embodiment, the asymmetrical I/O structure comprises a first power supply node connected to a first voltage, a second power supply node connected to a second voltage, a pull-up unit and a pull-down unit which are connected between the first power supply node and the second power supply node. The first voltage is higher than the second voltage. A node between the pull-up unit and the pull-down unit is connected to an I/O node. The pull-up unit comprises one or more pull-up transistors, and the pull-down unit comprises one or more pull-down transistors. The number of the pull-up transistors is different from the number of the pull-down transistors.

3 Claims, 4 Drawing Sheets

(56) References Cited

U.S. PATENT DOCUMENTS

| | | | | |
|---|---|---|---|---|
| 8,779,739 B2* | 7/2014 | Huang | ............... | H02M 3/1588 |
| | | | | 327/108 |
| 9,385,718 B1* | 7/2016 | Liu | ................. | H03K 19/01721 |
| 9,798,345 B1* | 10/2017 | Jao | ....................... | G06F 1/3296 |
| 10,027,321 B2* | 7/2018 | Chiang | ............. | H03K 19/0027 |
| 10,347,325 B1* | 7/2019 | Chou | ................ | H03K 19/0948 |
| 10,892,760 B1* | 1/2021 | Rao | ............... | H03K 19/017509 |
| 11,652,487 B1* | 5/2023 | Manipatruni | .. | H03K 19/018521 |
| | | | | 326/121 |
| 2003/0067318 A1* | 4/2003 | Takahashi | ........ | G01R 31/31721 |
| | | | | 324/762.02 |
| 2003/0222682 A1* | 12/2003 | Yu | ................... | H03K 19/00315 |
| | | | | 327/108 |
| 2003/0222683 A1* | 12/2003 | Yu | ..................... | H03K 19/0005 |
| | | | | 327/108 |
| 2004/0008056 A1* | 1/2004 | Kursun | ............. | H03K 19/0016 |
| | | | | 326/96 |
| 2005/0104622 A1* | 5/2005 | Chen | ................... | H03K 17/102 |
| | | | | 326/57 |
| 2007/0194804 A1* | 8/2007 | Kase | ............... | H03K 19/01721 |
| | | | | 326/27 |
| 2011/0050290 A1* | 3/2011 | Lee | ................. | H03K 19/01721 |
| | | | | 327/108 |
| 2012/0223767 A1* | 9/2012 | Wang | ............. | H03K 19/00361 |
| | | | | 327/543 |
| 2016/0173085 A1* | 6/2016 | Chiang | ........... | H03K 19/00384 |
| | | | | 327/109 |
| 2020/0076429 A1* | 3/2020 | Anand | ............... | H03K 17/6877 |
| 2022/0060187 A1* | 2/2022 | Zhang | .............. | H03K 19/0005 |
| 2022/0069822 A1* | 3/2022 | Moon | ............. | H03K 19/01742 |

* cited by examiner

ASYMMETRICAL I/O STRUCTURE

REFERENCE TO RELATED APPLICATION

This application claims priority to Chinese Application number CN2020108365339, filed on Aug. 19, 2020, the contents of which are incorporated herein by reference.

TECHNICAL FIELD

The application generally relates to the technical field of integrated circuits, in particular to an asymmetrical input/output (I/O) structure.

BACKGROUND

In terms of current technology, integrated circuits (IC) can be used to perform many different types of work at the same time, and packaging many circuits into a chip or integrating circuits for different purposes into one component can increase overall capability of the integrated circuits. Integrated circuits usually comprise one or more I/O units, which are interface circuits for signal interaction between internal circuits of the integrated circuits and external device circuits.

The traditional input/output structures are all symmetrical structures. When the operating voltage of a single transistor device is not lower than power supply voltage, a single transistor design is generally adopted, i.e., pull-down structure (NMOS transistor) and pull-up structure (PMOS transistor) are a symmetrical structure and both composed of a single transistor. When the operating voltage of a single transistor device is lower than the power supply voltage, a stacked design is adopted, i.e., pull-down structure (NMOS transistor) and pull-up structure (PMOS transistor) are a symmetrical structure and both composed of two transistors or multiple transistors (including transistors in series and/or parallel). Current design schemes, especially the stacked design, are often not the best scheme and its defects become obvious as the chip manufacturing process enters advanced nodes.

On the one hand, since the line width of manufacturing process is decreasing continuously, the operating voltage of the device is also continuously decreasing. In certain application fields, such as high-speed interfaces, that the nominal voltage of the fastest device may be lower than the power supply voltage, in order to meet the requirements of voltage withstanding and reliability, the stacked design is adopted, which may result in a certain degree of performance degradation. On the other hand, there are more and more separate manufacturing processes between NMOS transistor and PMOS transistor, such as gate dielectrics, work function matching materials, strain processes, etc., so that the reliability indexes of NMOS transistor and PMOS transistor may be quite different, which are reflected in time dependent dielectric breakdown (TDDB), hot carrier injection (HCl), bias temperature instability (BTI) and so on. According to these characteristics and some specific designs and applications, including voltage range, duty cycle, data flip rate, area, bias mode, etc., the service cycle of NMOS transistor and PMOS transistor may be quite different. Therefore, the present application proposes a high-performance asymmetrical I/O structure.

SUMMARY OF THE INVENTION

In accordance with an aspect of the present invention, an asymmetrical I/O structure is provided. The asymmetrical I/O structure may comprise a first power supply node connected to a first voltage, a second power supply node connected to a second voltage, a pull-up unit and a pull-down unit which are connected between the first power supply node and the second power supply node. The first voltage is higher than the second voltage. A node between the pull-up unit and the pull-down unit is connected to an I/O node. The pull-up unit comprises one or more pull-up transistors, and the pull-down unit comprises one or more pull-down transistors. The number of the pull-up transistors is different from the number of the pull-down transistors.

In one embodiment, the pull-up unit may comprise a first pull-up transistor, the pull-down unit may comprise a first pull-down transistor and a second pull-down transistor connected in series, the pull-up transistor is a PMOS transistor and the pull-down transistors are NMOS transistors.

In one embodiment, a source of the first pull-up transistor is connected to the first power supply node, a drain of the first pull-up transistor is connected to the I/O node, a gate of the first pull-up transistor is connected to an ground voltage when the first pull-up transistor is turned on, and to the first voltage when the first pull-up transistor is turned off. A source of the first pull-down transistor is connected to the second power supply node, a drain of the first pull-down transistor is connected to a source of the second pull-down transistor, a gate of the first pull-down transistor is connected to a maximum operating voltage when the first pull-down transistor is turned on, and the gate of the first pull-down transistor is connected to the ground voltage when the first pull-down transistor is turned off. A drain of the second pull-down transistor is connected to the I/O node, and a gate of the second pull-down transistor is connected to the maximum operating voltage, or the gate of the second pull-down transistor is connected to the first voltage when the second pull-down transistor is turned on, and the gate of the second pull-down transistor is connected to a difference voltage between the first voltage and the maximum operating voltage when the second pull-down transistor is turned off.

In one embodiment, the first voltage is greater than the maximum operating voltage.

In one embodiment, the first pull-up transistor, the first pull-down transistor, and the second pull-down transistor are respectively formed by one or more transistors connected in parallel.

In one embodiment, the pull-up unit may comprise a first pull-up transistor and a second pull-up transistor connected in series, the pull-down unit may comprise a first pull-down transistor, the pull-up transistors are PMOS transistors, and the pull-down transistor is an NMOS transistor.

In one embodiment, a source of the first pull-up transistor is connected to the first power supply node, a drain of the first pull-up transistor is connected to a source of the second pull-up transistor, a gate of the first pull-up transistor is connected to a difference voltage between the first voltage and a maximum operating voltage when the first pull-up transistor is turned on, and the gate of the first pull-up transistor is connected to the first voltage when the first pull-up transistor is turned off. A drain of the second pull-up transistor is connected to the I/O node, a gate of the second pull-up transistor is connected to the difference voltage between the first voltage and the maximum operating voltage, or the gate of the second pull-up transistor is connected to the difference voltage between the first voltage and the maximum operating voltage when the second pull-up transistor is turned on, and the gate of the second pull-up transistor is connected to the first voltage when the second pull-up transistor is turned off. A source of the first pull-down transistor is connected to the second power supply node, a drain of the first pull-down transistor is connected to the I/O node, a gate of the first pull-down transistor is connected to the first voltage when the first pull-down transistor is turned on, and the gate of the first pull-down transistor is connected to the ground voltage when the first pull-down transistor is turned off.

In one embodiment, the first voltage is greater than the maximum operating voltage.

In one embodiment, the first pull-up transistor, the second pull-up transistor, and the first pull-down transistor are respectively formed by one or more transistors connected in parallel.

In one embodiment, the node between the pull-up unit and the pull-down unit is connected to the I/O node via a resistor.

The above is an overview of the application, which may be simplified, summarized and omitted in detail. Therefore, those skilled in the art should realize that this part is only illustrative and is not intended to limit the scope of the application in any way. This summary section is neither intended to determine the key features or essential features of the claimed subject matter, nor is it intended to be used as an auxiliary means to determine the scope of the claimed subject matter.

BRIEF DESCRIPTION OF THE FIGURES

Non-limiting and non-exhaustive embodiments of the present application are described with reference to the following drawings, where like reference numerals refer to like parts throughout the various views unless otherwise specified.

DETAILED DESCRIPTION

Various aspects and examples of the present application will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

A first embodiment of the present application discloses an asymmetrical I/O structure, which comprises a first power supply node, a second power supply node, and a pull-up unit and a pull-down unit connected between the first power supply node and the second power supply node. A node between the pull-up unit and the pull-down unit is connected to an I/O node. The pull-up unit comprises one or more pull-up transistors and the pull-down unit comprises one or more pull-down transistors, wherein the number of the pull-up transistors is different from the number of the pull-down transistors. The pull-up transistor may be a first type transistor and the pull-down transistor may be a second type transistor. The I/O node can be connected to an external circuit to realize signal interaction between an internal circuit of a chip and an external device circuit.

In one embodiment, the pull-up unit may comprise one, two, three or more pull-up transistors, and the pull-down unit may comprise one, two, three or more pull-down transistors, wherein the number of pull-up transistors and the number of pull-down transistors is different. In one embodiment, the pull-up unit is a single transistor design and the pull-down unit is a stacked design, for example, the pull-up unit comprises one pull-up transistor and the pull-down unit comprises two pull-down transistors connected in series.

It should be understood that inputting and outputting signals are realized by turning on/off of the pull-up unit and the pull-down unit, i.e., by turning on/off of the pull-up transistor(s) and the pull-down transistor(s). When the pull-up unit or the pull-down unit comprises two or more transistors, turning on/off of pull-up unit and the pull-down unit requires the two or more transistors of the pull-up unit or the pull-down unit to be turned on/off at the same time.

Figure 1:
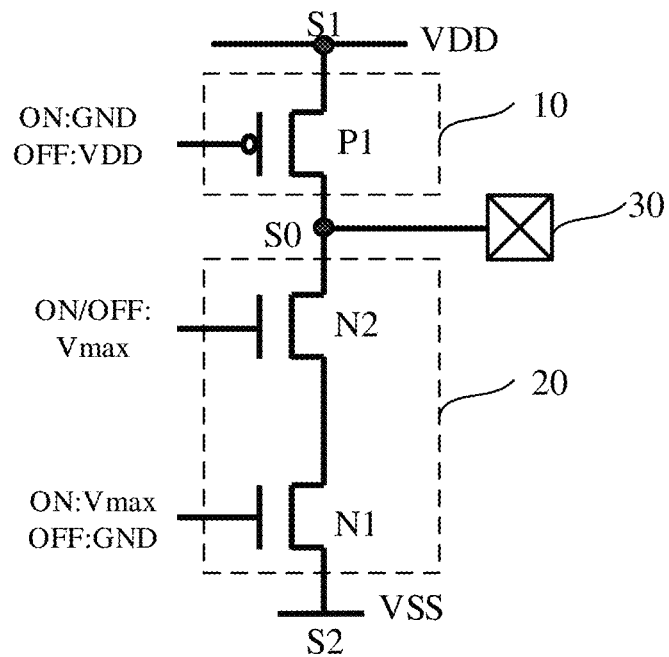
FIG. 1 shows a schematic diagram of an asymmetrical I/O structure adopting a single PMOS transistor and two NMOS transistors according to an embodiment of the present application.

FIG. 1 shows a schematic diagram of an asymmetrical I/O structure according to an embodiment. The asymmetrical I/O structure comprises a first power supply node S1, a second power supply node S2, a pull-up unit 10 and a pull-down unit 20 connected between the first power supply node S1 and the second power supply node S2. A node S0 between the pull-up unit 10 and the pull-down unit 20 is connected to the I/O node 30. The I/O node 30 may be a pad or pin. The pull-up unit 10 comprises a first pull-up transistor P1, the pull-down unit 20 comprises a first pull-down transistor N1 and a second pull-down transistor N2. The pull-up transistor P1 is a PMOS transistor, and the pull-down transistors N1, N2 are NMOS transistors. The voltage of the first power supply node S1 is a first voltage VDD, and the voltage of the second power supply node S2 is a second voltage VSS. Generally, the first voltage VDD is higher than the second voltage VSS.

In one embodiment, a source of the first pull-up transistor P1 is connected to the first power supply node S1, and a drain of the first pull-up transistor P1 is connected to the I/O node 30. The first pull-up transistor P1 is turned on (ON) when a gate of the first pull-up transistor P1 is connected to a ground voltage GND, and the first pull-up transistor P1 is turned off (OFF) when the gate of the first pull-up transistor P1 is connected to the first voltage VDD. Preferably, the first voltage VDD may be a power supply voltage. A source of the first pull-down transistor N1 is connected to the second power supply node S2, and a drain of the first pull-down transistor N1 is connected to a source of the second pull-down transistor N2. The first pull-down transistor N1 is turned on when a gate of the first pull-down transistor N1 is connected to a maximum operating voltage Vmax, and the first pull-down transistor N1 is turned off when the gate of the first pull-down transistor N1 is connected to the ground voltage GND. The maximum operating voltage is the maximum withstand voltage of the transistor. In one embodiment, the first voltage VDD is greater than the maximum operating voltage Vmax. In one embodiment, the second voltage VSS is less than the maximum operating voltage Vmax. Preferably, the second voltage VSS is a ground voltage. A drain of the second pull-down transistor N2 is connected to the I/O node 30, and a gate of the second pull-down transistor N2 is connected to the maximum operating voltage Vmax, regardless of whether the second pull-down transistor is turned on or off.

Generally, the first voltage VDD may be greater than the maximum operating voltage Vmax of the transistor, but it will be understood by those skilled in the art that the first voltage VDD may be less than or equal to the maximum operating voltage Vmax of the transistor, which is set according to the actual operating requirements of the circuit, and the present application is not limited to this.

Figure 2:
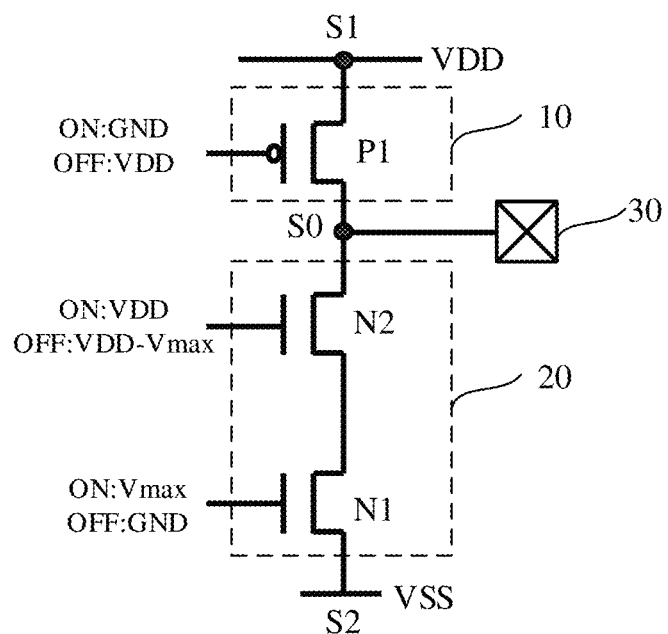
FIG. 2 shows a schematic diagram of an asymmetrical I/O structure adopting a single PMOS transistor and two NMOS transistors according to another embodiment of the present application.

FIG. 2 shows a schematic diagram of an asymmetrical I/O structure according to another embodiment. The circuit structure in this embodiment is the same as that shown in FIG. 1, and when the first pull-up transistor P1 and the first pull-down transistor N1 are turned on and off, their gate voltages in FIG. 2 are the same as those in FIG. 1. When the gate of the second pull-down transistor N2 is connected to the first voltage VDD, the second pull-down transistor N2 is turned on, and when the gate of the second pull-down transistor N2 is connected to a difference voltage (VDD-Vmax) between the first voltage VDD and the maximum operating voltage Vmax, the second pull-down transistor N2 is turned off. In this embodiment, when the second pull-down transistor N2 is turned off, since the gate voltage VDD-Vmax applied is smaller than the maximum operating voltage Vmax, the gate-source voltage of the second pull-down transistor N2 is smaller, thereby reducing channel leakage current and reducing static power consumption.

In one embodiment, the node S0 between the pull-up unit 10 and the pull-down unit 20 may be connected to the I/O node 30 through a resistor (not shown).

Figure 3:
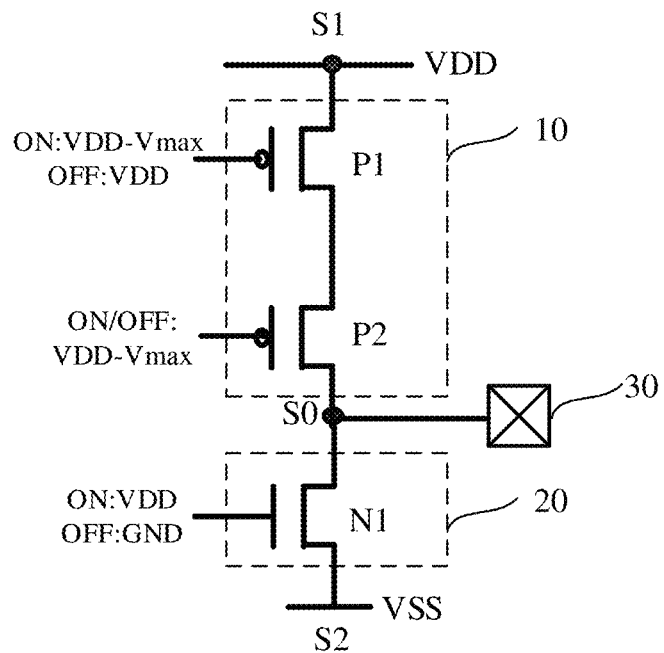
FIG. 3 shows a schematic diagram of an asymmetrical I/O structure adopting two PMOS transistors and a single NMOS transistor according to an embodiment of the present application.

FIG. 3 shows a schematic diagram of an asymmetrical I/O structure according to another embodiment. The asymmetrical I/O structure comprises a first power supply node S1, a second power supply node S2, a pull-up unit 10 and a pull-down unit 30 connected between the first power supply node S1 and the second power supply node S2. A node S0 between the pull-up unit 10 and the pull-down unit 20 is connected to the I/O node 30. The pull-up unit 10 comprises a first pull-up transistor P1 and a second pull-up transistor P2, and the pull-down unit 20 comprises a first pull-down transistor N1. The pull-up transistors P1, P2 are PMOS transistors and the pull-down transistor N1 is an NMOS transistor. The voltage of the first power supply node S1 is a first voltage VDD, and the voltage of the second power supply node S2 is a second voltage VSS. Generally, the first voltage VDD is higher than the second voltage VSS.

In one embodiment, a source of the first pull-up transistor P1 is connected to the first power supply node S1, a drain of the first pull-up transistor P1 is connected to a source of the second pull-up transistor P2, the first pull-up transistor P1 is turned on (ON) when a gate of the first pull-up transistor P1 is connected to a difference voltage (VDD-Vmax) between the first voltage VDD and a maximum operating voltage Vmax, and the first pull-up transistor P1 is turned off (OFF) when the gate of the first pull-up transistor P1 is connected to the first voltage VDD. The maximum operating voltage is the maximum withstand voltage of the transistor. In one embodiment, the first voltage VDD is greater than the maximum operating voltage Vmax. In one embodiment, the second voltage VSS is less than the maximum operating voltage Vmax. Preferably, the voltage VSS is a ground voltage. A drain of the second pull-up transistor P2 is connected to the I/O node 30, and a gate of the second pull-up transistor P2 is connected to the difference voltage (VDD-Vmax) between the first voltage VDD and the maximum operating voltage Vmax, regardless of whether the second pull-up transistor P2 is turned on or off. A source of the first pull-down transistor N1 is connected to the second power supply node S2, a drain of the first pull-down transistor N1 is connected to the I/O node 30, the first pull-down transistor N1 is turned on when a gate of the first pull-down transistor N1 is connected to the first voltage VDD, and the first pull-down transistor N1 is turned off when the gate of the first pull-down transistor N1 is connected to the ground voltage GND.

Figure 4:
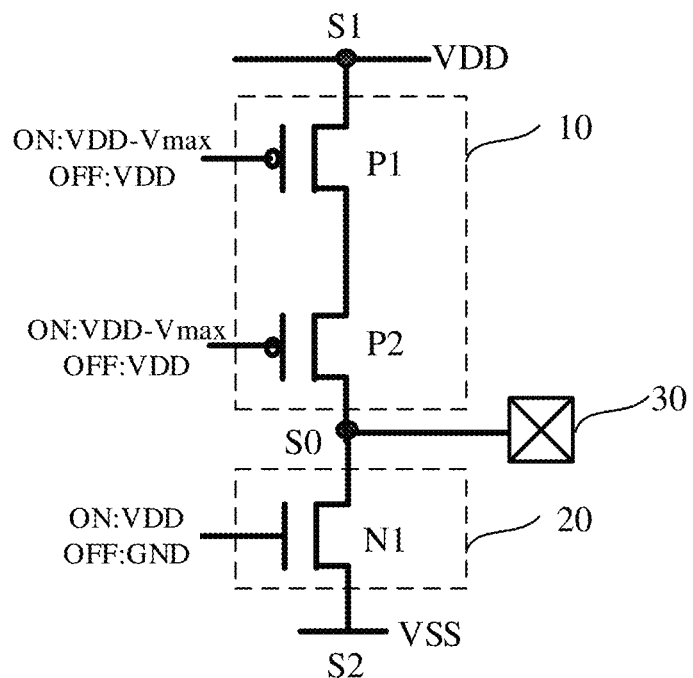
FIG. 4 shows a schematic diagram of an asymmetrical I/O structure adopting two PMOS transistors and a single NMOS transistor according to another embodiment of the present application.

FIG. 4 shows a schematic diagram of an asymmetrical I/O structure according to another embodiment. The circuit structure in this embodiment is the same as that of FIG. 3, and the gate voltages when the first pull-up transistor P1 and the first pull-down transistor N1 are turned on and off, their gate voltages in FIG. 4 are the same as those in FIG. 3. The second pull-up transistor P2 is turned on when the gate of the second pull-up transistor P2 is connected to the difference voltage (VDD-Vmax) between the first voltage VDD and the maximum operating voltage Vmax, and the second pull-up transistor P2 is turned off when the gate of the second pull-up transistor P2 is connected to the first voltage VDD. In this embodiment, when the second pull-up transistor P2 is turned off, the gate voltage VDD-Vmax of the second pull-up transistor P2 is smaller than the voltage Vmax, so that the gate-source voltage of the second pull-down transistor N2 is smaller, thereby reducing channel leakage current and reducing static power consumption.

In one embodiment, the node S0 between the pull-up unit 10 and the pull-down unit 30 is connected to the I/O node 30 through a resistor (not shown).

Figure 5:
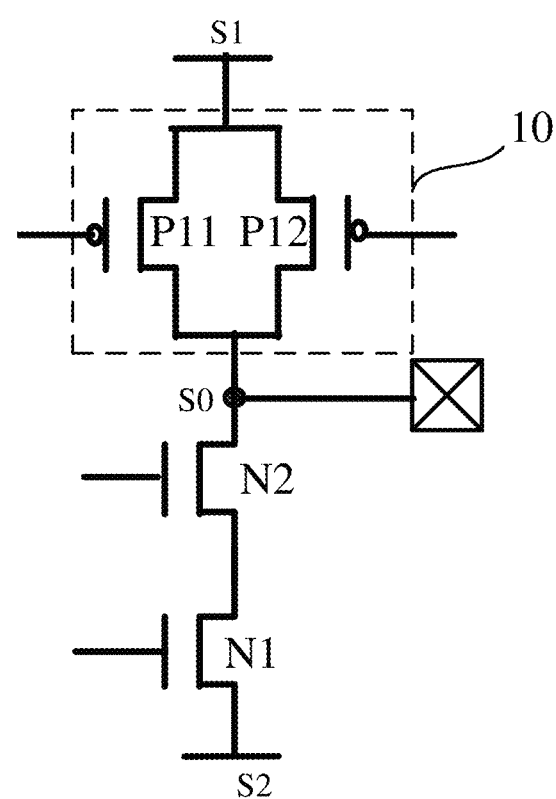
FIG. 5 shows a schematic diagram of an asymmetrical I/O structure with a pull-up unit adopting two PMOS transistors according to yet another embodiment of the present application.
Figure 6:
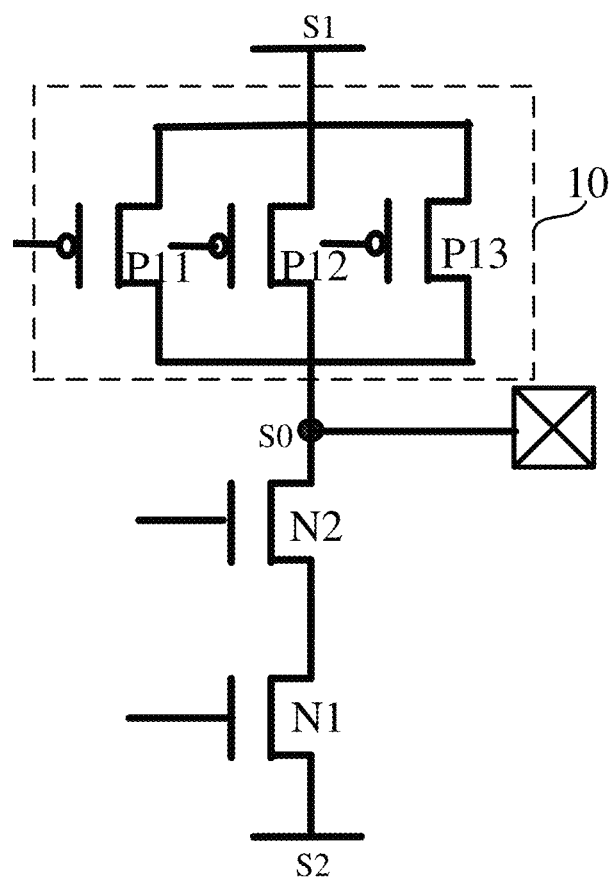
FIG. 6 shows a schematic diagram of an asymmetrical I/O structure with a pull-up unit adopting three PMOS transistors according to still another embodiment of the present application.

It should be noted that one, two, three, or more transistors in this application are defined by electrical connection, rather than by layout or subjective understanding. As shown in FIG. 5, the pull-up unit 10 may comprise two pull-up transistors P11, P12 connected in parallel, and as shown in FIG. 6, the pull-up unit 10 may comprise three pull-up transistors P11, P12, P12 connected in parallel. Although the PMOS transistor or NMOS transistor can be composed of two or several devices connected in parallel, all the terminals of these devices connected to the gates, sources and drains are exactly the same as those in the case of a single transistor in terms of electrical connection, so these cases should be regarded as "a single transistor", thus falling within the scope of protection of this application.

In the asymmetrical I/O structure disclosed in the present application, the pull-up unit and the pull-down unit respectively adopt a single transistor structure or a stacked structure, so that the device size is reduced under the same output impedance, thereby reducing capacitance and parasitic capacitance of the device, and reducing dynamic power consumption of the device operation. In addition, it can reduce sensitivity of the output impedance changing with the output voltage, improve linearity of the output impedance, avoid inter-symbol interference and improve signal integrity of the output signal. It should be pointed out that for the more general case of the asymmetrical I/O structure (not limited to one of the pull-up unit and the pull-down unit including a single transistor and the other including a stacked transistors), for example, one of the pull-up unit and the pull-down unit is a single transistor and the other is a stack of three transistors; or one of the pull-up unit and the pull-down unit is a stack of three transistors and the other is a stack of two transistors, the advantages still hold, so as to be within the scope of protection of this application.

It should be noted that in the application documents of the present application, relational terms such as first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In the application file of this application, if it is mentioned that an action is performed according to an element, it means the meaning of performing the action at least according to the element, and includes two cases: the behavior is performed only on the basis of the element, and the behavior is performed based on the element and other elements. Multiple, repeatedly, various, etc., expressions include 2, twice, 2 types, and 2 or more, twice or more, and 2 types or more types.

All references referred to in this specification are considered to be incorporated in their entirety in the disclosure of this application so as to serve as a basis for modification if necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes depicted in the drawings do not necessarily require the specific order or sequential order shown in order to achieve the desired results. In some embodiments, multitasking and parallel processing are also possible or may be advantageous.

What is claimed is:

1. An asymmetrical I/O structure, comprising:
a first power supply node connected to a first voltage and a second power supply node connected to a second voltage;
a pull-up unit and a pull-down unit which are connected between the first power supply node and the second power supply node, wherein a node between the pull-up unit and the pull-down unit is connected to an I/O node;
wherein the pull-up unit comprises one or more pull-up transistors including a first pull-up transistor, the pull-down unit comprises two or more pull-down transistors including a first pull-down transistor and a second pull-down transistor connected in series, and the number of the pull-up transistors is different from the number of the pull-down transistors, and the first voltage is higher than the second voltage;
a source of the first pull-up transistor is connected to the first power supply node, a drain of the first pull-up transistor is connected to the I/O node, a gate of the first pull-up transistor is connected to an ground voltage when the first pull-up transistor is turned on, and to the first voltage when the first pull-up transistor is turned off;
a source of the first pull-down transistor is connected to the second power supply node, a drain of the first pull-down transistor is connected to a source of the second pull-down transistor, a gate of the first pull-down transistor is connected to a maximum operating voltage when the first pull-down transistor is turned on, and the gate of the first pull-down transistor is connected to the ground voltage when the first pull-down transistor is turned off;
a drain of the second pull-down transistor is connected to the I/O node, and a gate of the second pull-down transistor is connected to the maximum operating voltage, or the gate of the second pull-down transistor is connected to the first voltage when the second pull-down transistor is turned on, and the gate of the second pull-down transistor is connected to a difference voltage between the first voltage and the maximum operating voltage when the second pull-down transistor is turned off.

2. The asymmetrical I/O structure of claim 1, wherein the first pull-up transistor is a PMOS transistor and the first pull-down transistors and second pull-down transistors are NMOS transistors.

3. The asymmetrical I/O structure of claim 1, wherein the first voltage is greater than the maximum operating voltage.

* * * * *